US006717337B2

(12) United States Patent
Howarth et al.

(10) Patent No.: US 6,717,337 B2
(45) Date of Patent: Apr. 6, 2004

(54) PIEZOELECTRIC ACOUSTIC ACTUATOR

(75) Inventors: Thomas R. Howarth, Portsmith, RI (US); James F. Tressler, Alexandria, VA (US); Joseph A. Bucaro, Herndon, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 258 days.

(21) Appl. No.: 09/862,345

(22) Filed: May 23, 2001

(65) Prior Publication Data

US 2002/0176592 A1 Nov. 28, 2002

(51) Int. Cl.$^{7}$ .............................................. H01L 41/08

(52) U.S. Cl. ...................... 310/369; 310/311; 310/324; 310/326; 310/328

(58) Field of Search ............................... 310/311, 324, 310/326–328, 357, 367, 369

(56) References Cited

U.S. PATENT DOCUMENTS

| | | | | | |
|---|---|---|---|---|---|
| 2,477,596 | A | * | 8/1949 | Gravley | 310/346 |
| 4,283,605 | A | * | 8/1981 | Nakajima | 381/190 |
| 4,302,695 | A | | 11/1981 | Boyles et al. | 310/324 |
| 4,864,918 | A | * | 9/1989 | Martin | 92/103 SD |
| 5,163,327 | A | | 11/1992 | Papai | 73/715 |
| 5,178,804 | A | | 1/1993 | Watanabe et al. | 264/29.7 |
| 5,371,428 | A | * | 12/1994 | Kikuchi et al. | 310/324 |
| 5,406,161 | A | | 4/1995 | Lee et al. | 310/324 |
| 5,471,721 | A | | 12/1995 | Haertling | 29/25.35 |
| 5,481,152 | A | * | 1/1996 | Buschulte | 310/328 |
| 5,632,841 | A | | 5/1997 | Hellbaum et al. | 156/245 |
| 5,802,195 | A | | 9/1998 | Regan et al. | 381/190 |
| 5,849,125 | A | | 12/1998 | Clark | 156/222 |
| 5,965,970 | A | * | 10/1999 | Takeuchi et al. | 310/324 |
| 6,012,779 | A | | 1/2000 | Morris | 300/459 |
| 6,045,642 | A | * | 4/2000 | Takeuchi et al. | 156/89.11 |
| 6,060,811 | A | | 5/2000 | Fox et al. | 310/311 |
| 6,232,702 | B1 | * | 5/2001 | Newnham et al. | 310/334 |
| 6,274,261 | B1 | * | 8/2001 | Tinker et al. | 429/27 |
| 6,348,115 | B1 | * | 2/2002 | Takeuchi et al. | 156/89.11 |
| 6,349,141 | B1 | | 2/2002 | Corsaro | 381/191 |
| 2003/0011282 | A1 | * | 1/2003 | Kishimoto | 310/324 |

FOREIGN PATENT DOCUMENTS

| | | | | |
|---|---|---|---|---|
| JP | 4-207800 | * | 7/1992 | 381/190 |

OTHER PUBLICATIONS

Broadband control of plate radiation using a piezoelectric, double–amplifier active skin and structural acoustic sensing; B. Johnson and C. Fuller; VA Polytech Univ; J. Acoust. Soc. Am; pp. 876–884, Feb. 2000.

Piezoelectric air transducer for active noise control; B. Xu, Q. Zhang, V.D. Kugel, and L.E. Cross; Penn State Univ; pp. 388–398; SPIE vol. 2717, 1–96.

(List continued on next page.)

*Primary Examiner*—Thomas M. Dougherty
(74) *Attorney, Agent, or Firm*—John J. Karasek; Sally Ferrett

(57) ABSTRACT

An acoustic actuator comprises a radially poled piezoelectric or electrostrictive drive element which is electroded on its inner and outer faces, and an acoustic diaphragm coupled to the upper surface of the piezoelectric drive element. As a voltage is applied to the electrodes, the piezoelectric drive element expands and contracts in the radial direction and the acoustic diaphragm displaces upward or downward, generating a sound wave. In an alternative embodiment, the piezoelectric or electrostrictive drive element is comprised of several subelements laid end to end and radially poled. In another embodiment, the piezoelectric or electrostrictive drive element is comprised of several subelements laid end to end which are thickness-poled reduced and internally biased oxide wafers of piezoelectric material.

56 Claims, 11 Drawing Sheets

OTHER PUBLICATIONS

Active Control of Structurally Radiated Sound Using Integrated Piezoelectric Double Amplifier Skin; C.R. Fuller, M. Wenzel, C. Guigou, B. Xu, V. Kugel, and E. Cross; 1996 ONR Materials and Transducers Workshop; Penn State Univ; Mar. 25–27, 1996.

Acoustical performance of an electrostrictive polymer film loudspeaker; R. Heydt, R. Pelrine, J. Joseph, J. Eckerle, and R. Kornbluh; J. Acoust. Soc. Am. 107, pp. 833–839, Feb. 2000.

Foam–Pvdf Smart Skin for Aircraft Interior Noise Control; C. Guigou; Dept of Mech. Eng.; Virginia Polytechnic University, Dec. 1, 1999.

Foam–Pvdf Smart Skin for Active Control of Sound; C. Fuller, C. Guigou, and C. Gentry; Mech. Eng. Dept; Virginia Polytechnic Univ; SPIE's 1996 Symposium, Feb. 26–29, 1996.

Control of Aircraft Interior Broadband Noise with Foam Pvdf Smart Skin; C. Gigou and C. Fuller; Mech. Eng. Dept.; Virginia Polytechnic Univ; Sep. 1998.

Active Control of Sound Radiation from Cylinders with Piezoceramic Actuators and Structural Acoustic Sensing; J. Maillard and C. Fuller; Mech. Eng. Dept., Polytechnic University, not dated.

Properties and Performance of RAINBOW Piezoelectric Actuator Stacks; M. Hooker; SPIE vol. 3044, pp. 413–420, 1997.

Relaxor Based Ferroelectric Single Crystals for Electromechanical Actuators; S. Park, V. Vedula, M. Pan, W. Hackenberger, P. Pertsch, and T. Shrout; SPIE vol. 3324, pp. 136–144; 3–87.

Rainbow Actuators and Sensors: A New Smart Technology; G. Haertling; SPIE vol. 3040; pp. 81–91, 1997.

Rainbow Ceramics–A New Type of Ultra–High–Displacement Actuator; G. Haertling; American Ceramic Society Bulletin; vol. 73, Jan. 94, p. 93.

* cited by examiner

FIG. 5a
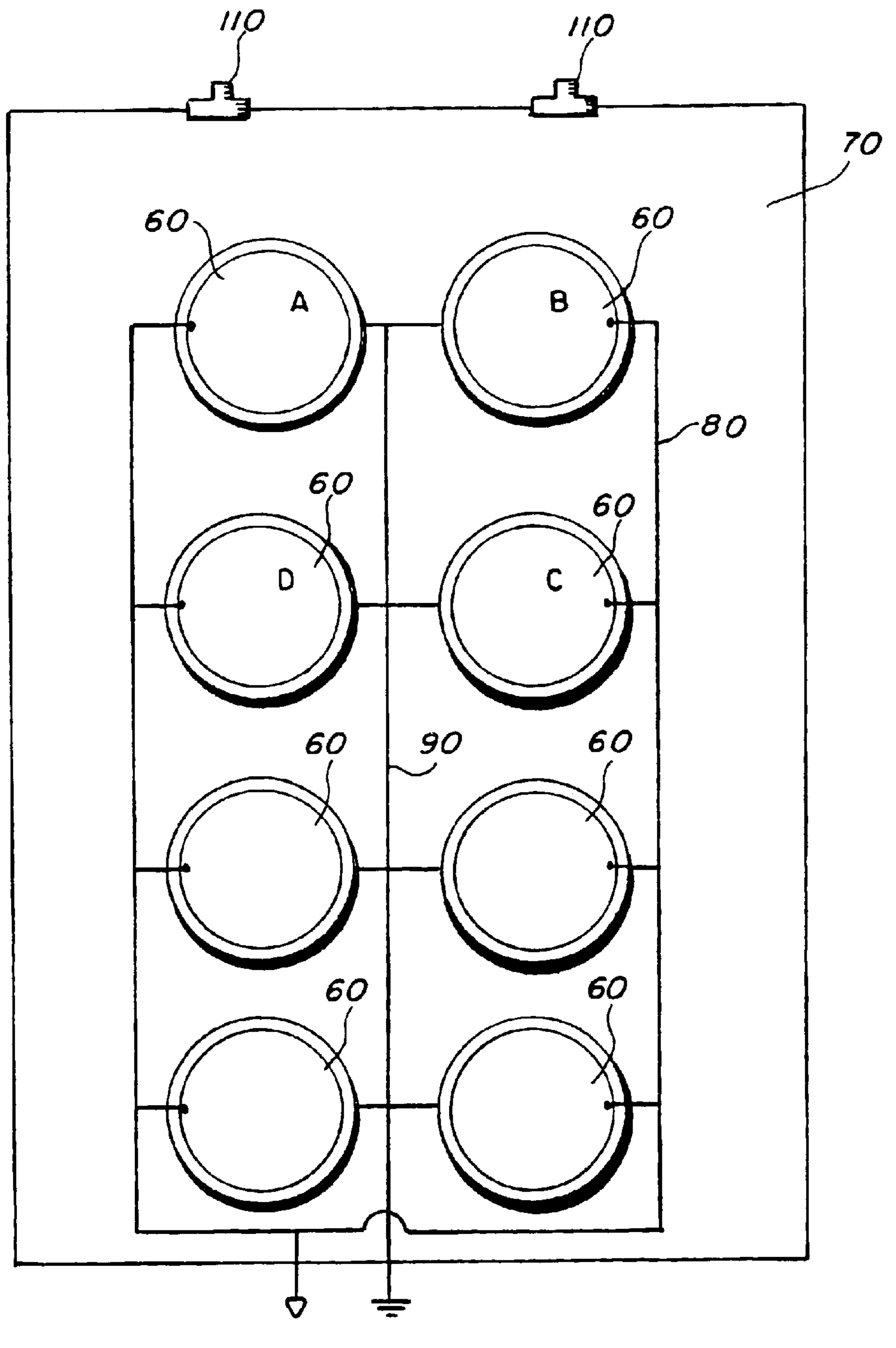
FIG. 5b

SHAPE NUMBER 1 AT FREQUENCY 150 Hz
SHAPES TAKEN FROM FILE: flxrsto.ringdisk.rev

PIEZOELECTRIC ACOUSTIC ACTUATOR

BACKGROUND OF THE INVENTION

1. Field of the Invention

The present invention relates to acoustic actuators, and more specifically, to actuators for structural and airborne sound generation and active acoustic and vibration control.

2. Description of the Related Art

There are two methods to control unwanted sound and vibration in structures. The first is passive control, and involves adding mass, stiffness, or damping to the structure. This first method is best suited to applications where the frequency band of the disturbance is above 1 or 2 kilohertz. The second method, known as active control, is based upon destructive interference of the sound or vibration field. In active control, a sensor/actuator combination, which is located on the surface of the vibrating structure, is used to detect and to suppress the disturbance. After sensing the disturbance signal, which may be acoustic or vibration or a combination thereof, the active control system reconfigures and conditions the signal, and drives the actuator such that the output field has the same magnitude but opposite phase as the disturbance.

The sensor and electronic subsystems in active vibration and acoustic control systems are more technically advanced than actuator components. Control systems have benefitted from faster and cheaper microelectronics. Similarly, a wide variety of sensors have been developed including optical sensors, piezopolymers, piezocomposites, and acoustic pressure sensors. Because of the wide variety of sensors available, sensor selections may now be based on application specific needs.

There is a pressing need for improvements in available actuator technology. Typically, the weakest link in most active control systems is in the actuator technology. Although actuator devices for underwater systems have been advanced, the use of such devices in-air has been limited by the characteristic impedance load mismatch between the device and the air medium (the impedance load of water is 3700 times higher than that of air). Consequently, the displacements of the in-air actuators must be much greater than the displacements of in-water actuators, in order to realize the same degree of improvement in acoustic suppression.

An in-air actuator which exhibits a large displacement at low frequency and has a linear near-field velocity (displacement) profile is urgently needed for applications such as structural active acoustic suppression and in-air active acoustic suppression. Other features which are desired include low weight, thin geometry, and low electrical impedance. Because many active control systems are in environments which require them to be configured as large sheets or panels, such as large vibrating machinery mounts on power plant type conditions, they must be rugged enough to withstand rigorous treatment.

Many active control systems utilize either hydraulics or large, heavy electromagnetic force transducers as the actuator component, which are unsuitable for applications requiring lightweight actuators. These technologies may often be constrained by packaging limitations as well as high cost.

In recent years, piezoelectric materials either in the form of piezoceramic-polymer composites, multilayer stacks, or in bender type configurations have been studied as the actuator components in active control applications. Multilayer stacks and peizoceramic-polymer composites are characterized as generating high force and low displacement, whereas the flexors exhibit low force and high displacement capabilities.

An example is described in U.S. Pat. No. 6,349,141, Robert Corsaro, Light Weight Polymeric Sound Generator. This approach uses 4 layers of piezoelectric or electrostrictive film configured as a dual bi-laminate bender. The top and bottom bilaminates are separately formed in a precurved press to form a rippled geometry, then are attached back to back, and optional flat cover plates are applied. Application of voltage to the bilaminates generates a net thickness change, resulting in displacement of the surface and a corresponding sound pressure level change.

Another example of an electrostrictive polymer film (EPF) based in-air acoustic projector is described in "Acoustic Performance of an Electrostrictive Polymer Film Loudspeaker", Richard Heydt, Ron Pelrine, Jose Joseph, Joseph Eckerle, and Roy Kornbluh, J. Acoustic Soc. Am. 107(2), February 2000, 833–839. The projector demonstrated appears to be most effective at relatively higher frequencies of 500–5000 Hz.

A piezoelectric in-air acoustic transducer based on applying a cover plate to two piezoelectric bimorph support structures is described in Baomin Xu, Qiming Zhang, V. D. Kugel and L. E. Cross, "Piezoelectric Air Transducer for Active Air Control", *Smart Structures and Materials* 1996*: Smart Structures and Integrated Systems*, Indirjit Chopra, Editor, Proc. SPIE 2717, 388–398 (1996).

Similarly, Brody D. Johnson and Chris R. Fuller disclose a method of using skin attached to structurally mounted piezoelectric bimorph supports for structural active acoustic control in "Broadband Control of Plate Radiation Using a Piezoelectric, Double-amplifier Active-skin and Structural Acoustic Sensing" Brody Johnson and Chris R. Fuller, J. Acoustic Soc. Am. 107(2), February 2000 876–884. The predicted power attenuation is in excess of 10 dB between 250 and 750 Hz.

None of the actuators to date have demonstrated sufficiently high displacement at low frequencies. A lightweight actuator has been developed which has high displacement at low frequencies as described herein.

SUMMARY OF THE INVENTION

It is an object of this invention to provide a lightweight, high power, low frequency sound generator useful for active acoustic control of airborne or structure-borne acoustic noise. It is another object of this invention to provide a smart acoustic blanket which can be adhered to a surface to acoustically cancel the undesired structure-borne acoustic noise.

It is another object of this invention to provide a smart acoustic blanket for acoustically canceling undesired airborne noise.

It is another object of this invention to provide small, lightweight high displacement acoustic actuators which produce high power sounds, responsive to electrical signals.

These and other objects are achieved by adhering a polymer membrane to the surface of a piezoelectric driver designed for a desired resonance frequency, and providing electrical signals to the inner and outer surfaces of the piezoelectric driver, producing vibration in the membrane at the desired resonance frequency.

BRIEF DESCRIPTION OF THE DRAWINGS

FIG. 5*a* is a top view of an acoustic blanket according to the invention.

FIG. 5*b* is a cross sectional view of an acoustic blanket according to the invention.

DESCRIPTION OF THE PREFERRED EMBODIMENTS

Figure 1:
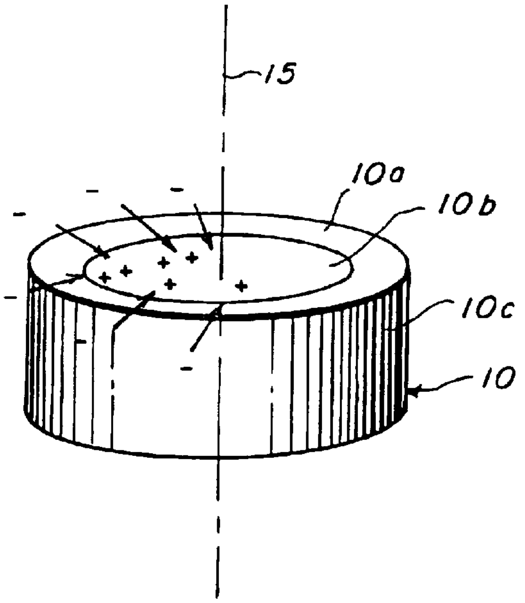
FIG. 1 illustrates a piezoelectric drive element.

FIG. 1 illustrates a piezoelectric drive element 10, having an upper surface 10*a*, an inner face, 10*b*, and an outer face 10*c*. The piezoelectric drive element is poled in the radial direction, indicated by arrows pointing outward from the central axis 15. Application of a drive voltage to the piezoelectric drive element 10 at the inner face 10*b* and outer face 10*c* will result in a expansion or contraction of the drive element 10 in the radial direction. The amount of deformation in the radial direction will depend on the drive element's strain coefficient $d_{33}$.

Figure 2A:
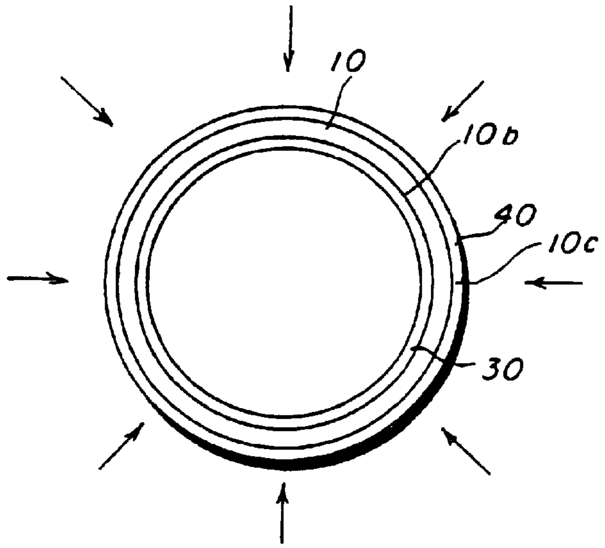
FIG. 2*a* is a top view of a piezoelectric drive element with electrodes.
Figure 2B:
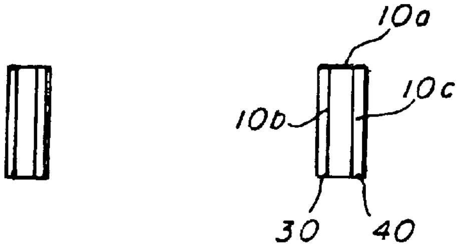
FIG. 2*b* is a cross sectional view of a piezoelectric drive element with electrodes.

FIGS. 2*a* and 2*b* illustrate the piezoelectric drive element with electrodes 30 and 40 applied to the inner face 10*b* and the outer face 10*c* of the drive element 10. The electrodes 30 and 40 are shown as a conductive metal coating on the inner and outer faces, 10*b* and 10*c*, respectively. The use of a conductive metal coating as an electrode allows wire leads (not shown) to be soldered to the coatings, and the conductive metal coating distributes the drive voltage to the face of the drive element evenly. Commonly, one wire lead carries a reference voltage, and the other wire lead carries a drive signal voltage. Application of the drive signal voltage causes the piezoelectric drive element to expand or contract in a radial direction. Expansion of the piezoelectric drive element 10 in response to application of a drive signal voltage is shown by the arrows in both FIGS. 2*a* and 2*b*.

Figure 3A:
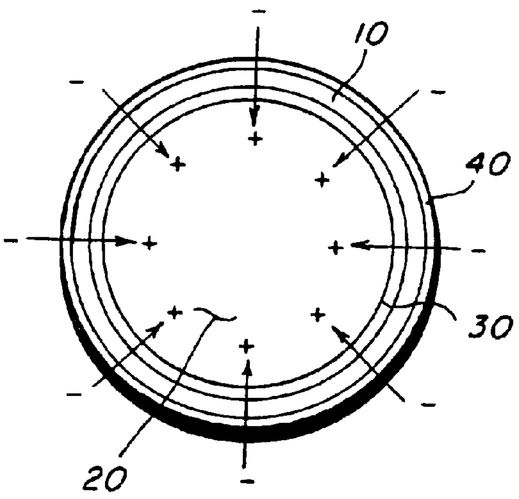
FIG. 3*a* is a top view of an acoustic actuator according to the invention.
Figure 3B:
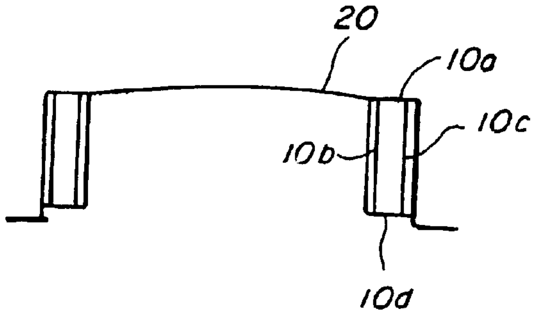
FIG. 3*b* is a cross sectional view of an acoustic actuator according to the invention.

FIGS. 3*a* and 3*b* illustrate a piezoelectric acoustic actuator according to the invention. Looking first at FIG. 3*a*, each actuator has a piezoelectric drive element 10, shown here as a ring. The drive element has an upper surface 10*a*, an inner face 10*b*, an outer face 10*c*, and a lower surface 10*d*. Electrodes 30 and 40 are applied to the inner face 10*b* and outer face 10*c*. The piezoelectric drive element is radially poled, and the arrows in FIG. 3*a* illustrate the radial poling direction and the corresponding $d_{33}$ direction of motion. Referring to FIG. 3*b*, the piezoelectric drive element 10 is mechanically coupled at its upper surface 10*a* to an acoustic diaphragm, 20, which may be a thin flexible membrane or shell. In the embodiment of the invention shown in FIG. 3*a* and FIG. 3*b*, the electrodes 30 and 40 are silver coatings applied to the inner and outer faces of the drive elements 10*b* and 10*c*, respectively.

Figure 4:
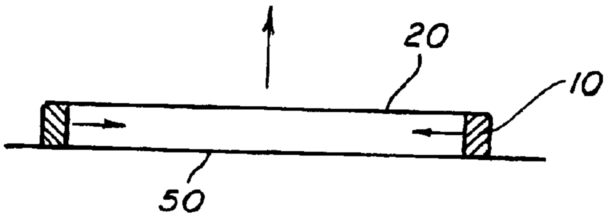
FIG. 4 is a cross sectional view of an acoustic actuator according to the invention.

When driven electrically, the piezoelectric drive element 10 either expands or contracts a very small amount in the radial direction, as shown in FIG. 4. The expansion or contraction motion of the piezoelectric drive element 10 causes the acoustic diaphragm 20 to displace a large amount either downwards or upwards, respectively. The upward and downward displacement of the diaphragm 20 generates sound waves in air. The acoustic diaphragm 20 thus acts as a mechanical transformer that enhances the radial mode of the piezoelectric drive element 10, and acoustically couples the radial motion into sound.

The frequency at which the acoustic membrane resonates is dependent upon the material properties of the diaphragm, and the thickness of the diaphragm, and the diameter of the diaphragm.

In FIG. 4, the piezoelectric drive element 10 is shown radially contracting in response to a positive applied voltage, causing an upward flexure in the acoustic diaphragm 20. Similarly, a radial expansion of the piezoelectric drive element 10, in response to a negative applied voltage, will cause a downward flexure in the acoustic diaphragm 20. In both cases, the displacement of the acoustic diaphragm 20, and the direction of the acoustic radiation will be orthogonal to the $d_{33}$ vibration mode direction of the piezoelectric drive element 10.

An optional backing, 50, is also shown in FIG. 4. The backing 50 can be the same material used for the acoustic diaphragm, although other materials may be used.

The acoustic actuator may be used for sound wave projection, or may be used to produce vibrations in a structure to which the actuator is coupled. When the actuator is mechanically coupled to a structure, such as a wall or a deck or machinery surface, application of an electrical signal will result in displacement of the diaphragm, and will generate a corresponding vibration in the structure.

Referring again to FIG. 4, the drive element 10 should be a piezoelectric or electrostrictive material which can be manufactured into the desired configuration and can be poled in the radial direction. Recommended materials include piezoelectric ceramics such as those in the lead zirconate titanate (PZT) family, or relaxor-based ferroelectric single crystal compositions.

The acoustic diaphragm 20 may be a membrane or a shell, and must have sufficient strength and stiffness to flex in response to the radial contraction and expansion of the piezoelectric drive element. The geometry of the acoustic diaphragm 20 may be flat or may be slightly dome shaped. A slightly dome shaped surface is believed to improve the flexure of the acoustic diaphragm 20.

Optimally, the acoustic diaphragm 20 is composed of materials which are easily manufactured into the desired configuration, for example, though molding, machining, or casting.

A polymer such as a thermoplastic Kapton polyimide film is useful as an acoustic diaphragm due to light weight, high compliance, stiffness, and low compressibility. Other materials with similar traits may also be used. Although the resonance frequency of the diaphragm is primarily dependant upon the diameter of the diaphragm, the thickness of the diaphragm, density of the diaphragm, and the stiffness of the diaphragm can also affect the resonance frequency. The number of layers of the diaphragm can be modified to tune the resonance frequency for a given diameter acoustic actuator. To further tune the resonance frequency, a small weight may be added to the diaphragm.

Acoustic Blanket with Piezoelectric Acoustic Actuators

FIGS. 5*a* and 5*b* illustrate the top view and cross sectional view of an acoustic blanket according to the invention. The acoustic blanket comprises an array of acoustic actuators 60. The acoustic actuators are electrically connected by wire leads 80 and 90 which are in contact with electrodes on the inner and outer faces of the piezoelectric drive elements of the acoustic actuators 60. Here, the drive signal wire lead 80 is connected to the electrode on the inner surface of the piezoelectric drive element and the reference signal (ground) wire lead 90 is connected to the electrode on the outer surface of the piezoelectric drive element.

The acoustic actuators 60 in the acoustic blanket shown in FIGS. 5*a* and 5*b* are connected by a flexible sheet 70. The sheet 70 may be the same material or similar materials to those which comprise the acoustic diaphragms, although this is not necessary for operation of the acoustic blanket. Other materials may be used to physically connect the acoustic actuators 60.

In the acoustic blanket shown in FIGS. 5*a* and 5*b*, the wire leads 80 and 90 are optimally arranged into a bus arrangement similar to leads on a printed circuit board. Acoustic actuators sized to have a fundamental (breathing) resonance frequency at different frequencies may be included in the acoustic blanket, providing the acoustic blanket a wider frequency response. It is not necessary that the sheet 70 be continuous. The acoustic blanket could incorporate voids between the individual acoustic actuators 60, giving increased mechanical flexibility to the acoustic blanket.

The location of the individual acoustic actuators in the array is selected with consideration for maximizing the acoustic output while minimizing the mutual acoustic impedance between the individual elements, and to maintaining the desired frequency response.

The acoustic blanket may be suspended, for acoustic projection into the surrounding environment. Clips 110, shown in FIG. 5*a*, may be used to suspend the acoustic blanket. The suspended acoustic blanket is effective as a lightweight loudspeaker, or as part of an active acoustic control system designed to minimize or eliminate noise in the surrounding space.

A backing 50, shown in FIG. 5*b*, may be attached to the sheet 70. The backing provides a convenient surface for adhesion of the acoustic blanket to a structure for active vibration control of the structure.

Two acoustic blankets may also be joined in a back to back configuration so that acoustic output can be realized from both sides of the blanket.

EXAMPLE 1

An acoustic blanket was designed to have a high displacement at low frequencies (below about 300 Hz). An acoustic blanket having eight 6.35-cm diameter piezoelectric driven acoustic actuators spaced in an equal two by four arrangement was manufactured as described herein.

Navy Type VI (PZT-5H) ceramic was selected as the material for the piezoelectric drive elements, based on its high $d_{33}$ strain coefficient. Note that other soft and hard PZTs would also be good material choices for a piezoelectric drive element, depending on the specific application.

Each piezoelectric drive element was ring shaped, with an outer diameter of 6.35 cm (2.5 inches), a wall thickness of 0.2 cm (0.08 inches), and a height of 0.64 cm (0.25 inches). Silver was applied to both the inner and outer faces of each piezoelectric drive element, to act as electrodes for application of the electrical drive signal via wire leads.

Figure 6:
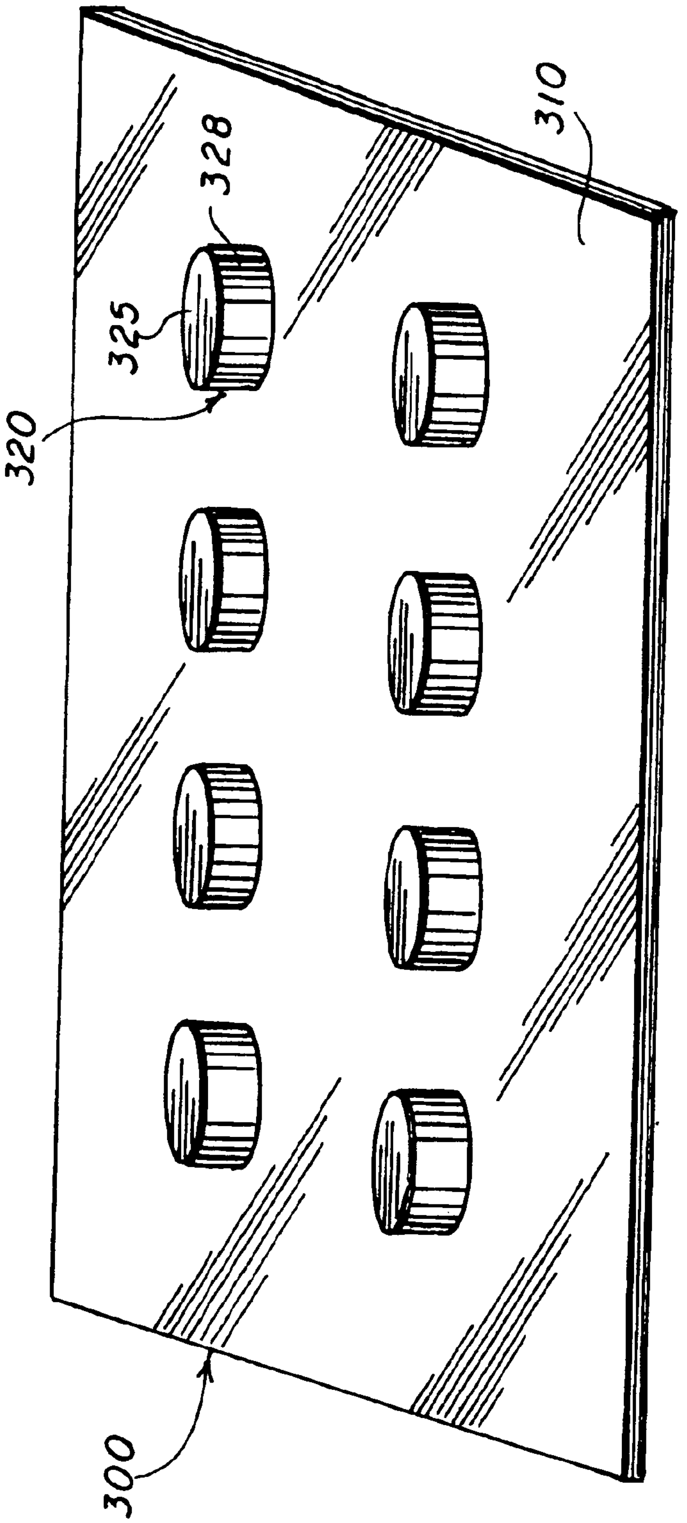
FIG. 6 is a perspective view of a steel mold used to thermoset an acoustic blanket according to the invention.

Refer next to FIG. 6. To form the film into the desired shape, a steel mold 300 was prepared using a 15-5 steel plate 310 which was dimensionally 35.6-cm by 66-cm and 12.7-cm thick, along with eight solid steel disks, 320, each of 15-5 steel, 6.35-cm (2.5 inches) in diameter and 0.64-cm (0.25 inches) in height. The top surface 325 of each steel disk 320 had a slightly convex spherical shape, with a 50.8-cm radius (0.29 degrees). The top 325 and side 328 surfaces of the steel disks 320 were machined smooth while the surface of the steel plate 310 was left in the as-milled condition. The steel disks 320 were attached with screws to the steel plate 310 at the desired locations.

The materials selected for the acoustic diaphragm were layers of DuPont's Kapton E film and DuPont's KJ polyimide film, which is a thermoplastic material with a glass transition temperature of approximately 275° C. The advantageous characteristics of the KJ polyimide were a low Young's modulus (400 Kpsi) and a density of 1.36 grams/cubic centimeter (ASTM D-1004-66-1981). The Kapton E was used to add sufficient stiffness to the KJ polyimide film.

A sheet of KJ polyimide film approximately 50 $\mu$m in thickness was cut into circular pieces about 10-cm in diameter.

The steel mold was coated with a release agent, and a 10-cm diameter piece of KJ polyimide film was placed over each of the eight steel disks. Note that on several of the disks, two layers of KJ polyimide film were stacked, and on several other disks, three layers of KJ polyimide film were stacked. Next, a circular 6.3-cm diameter (approximately equal to the diameter of the piezoelectric drive element) piece of Kapton E was layered over the KJ polyimide film layer(s), to add stiffness. Finally, a sheet of fiberglass cloth, and another sheet of Kapton E film were layered over the Kapton E and KJ polyimide film circles.

Figure 7A:
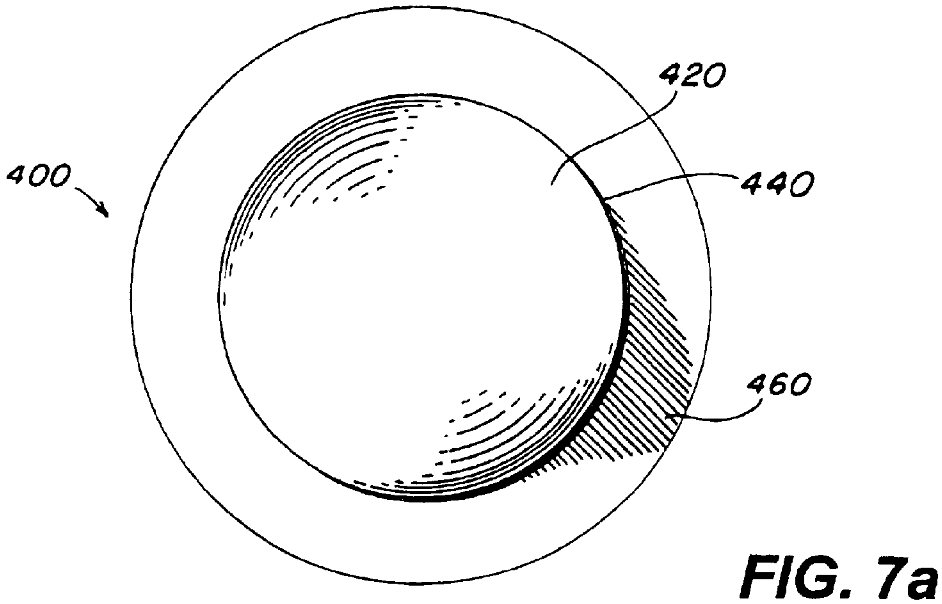
FIG. 7*a* is a top view of a film bubble.
Figure 7B:
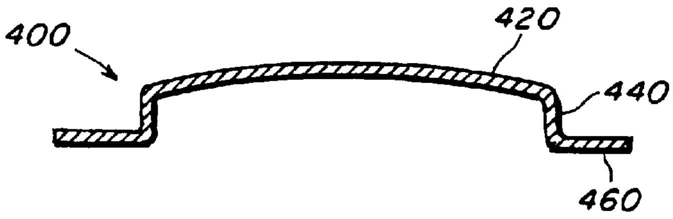
FIG. 7*b* is a cross sectional view of a film bubble.

The final sheet of Kapton E was sealed around the edges of the metal plate and the interior was evacuated with a mechanical pump. The assembly was then placed in an autoclave. The autoclave temperature and pressure were increased to 325° C. and 300 psi and maintained at this temperature and pressure for 3 hours, to thermoset the film. The temperature and pressure of the autoclave were then reduced to ambient temperature and pressure. The KJ polyimide film conformed to the shape of the steel disks, and remained in this shape as the temperature and pressure were reduced to ambient. The mold with the resulting disk-shaped film bubbles was then removed from the autoclave, the film bubbles were removed from the mold, and the Kapton/fiberglass layer was peeled off the film bubbles. The resulting film bubble 400 is shown in FIG. 7. The top portion of the film bubble 420, which will form the acoustic diaphragm of the acoustic actuator, has a slightly dome shape matching the curve of the top surface of the mold's steel disks. The sides of the film bubble, 440, and some excess KJ material 460, also roughly match the shape of the steel mold, and will be used to connect the acoustic actuator to the acoustic blanket sheet material.

In order to assemble the acoustic blanket, a release agent was applied to the steel mold previously used for making the film bubbles. A 33-cm by 61-cm sheet of Kapton E film having eight circular cut-outs corresponding to the locations of the mold's steel disks was laid over the mold. Thin nickel ribbon wire leads were then attached to the blanket using small pieces of Kapton tape to hold the wires in place. The leads were placed so they extended beyond the edge of the sheets of Kapton E film at each cutout.

The pre-formed individual film bubbles, manufactured as described above, were next placed over the steel disks of the mold, and a sheet of KJ polyimide film with identical cut-outs was laid over both the Kapton E film and the wire leads, so that the edges of the KJ film cut out areas corresponded to the edges of the KJ excess material of the film bubbles. Another sheet of Kapton E film, with cut outs over each of the mold's steel disks, was laid over the film bubbles. A sheet of fiberglass cloth, followed by a final layer of Kapton E, were then placed over the assembly, and the edges of the Kapton E film were sealed around the edges of the mold. A hole was cut in the Kapton E film, a vacuum fitting was attached, and a vacuum was applied to draw the assembly together and to ensure that there were no system leaks. The assembly was heated in an autoclave at a temperature of 325° C. and 300 psi for one hour, the autoclave was cooled to ambient temperature and pressure, and the assembly was then removed from the autoclave. The acoustic blanket was then removed from the mold. The fiberglass cloth was peeled away from the surface of the acoustic blanket.

Figure 8:
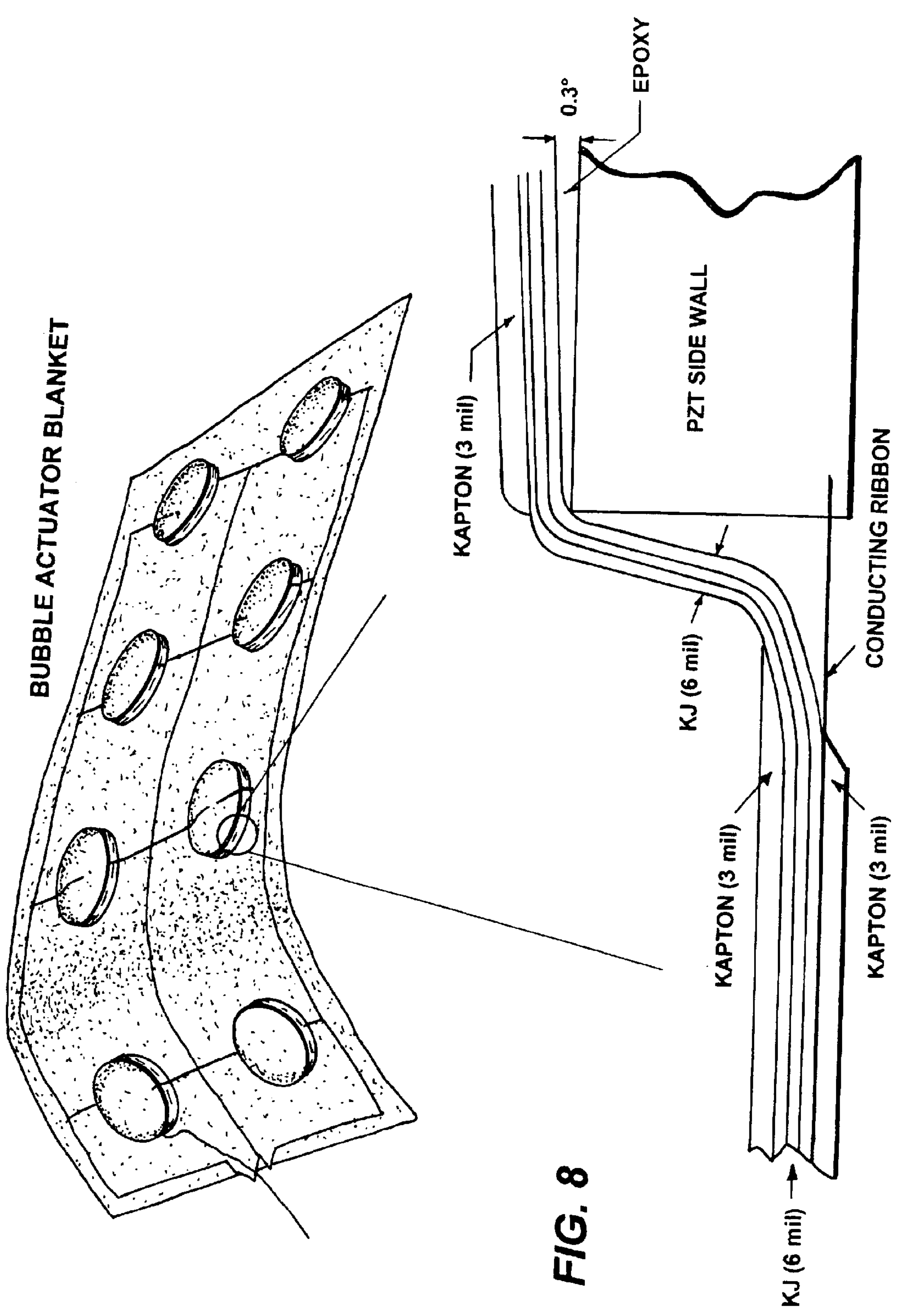
FIG. 8 is a cross sectional view of an acoustic actuator blanket.

FIG. 8 illustrates a cross section of an acoustic blanket at the interface with a film bubble. consisting of 3 layers of KJ polyimide and Kapton E film, where the Kapton E film of the acoustic diaphragm extends only to about the outer diameter of the drive element.

Next, the individual ring-shaped piezoelectric drive elements were placed into their corresponding film bubble locations in the acoustic blanket. The drive signal wire lead was soldered to the electrodes on the inner face of the drive element and the reference signal wire lead was soldered to the electrode on the outer face of the drive element. An epoxy was added between the upper surface of each drive element and the outer edge of each acoustic diaphragm, to bond the acoustic diaphragms to the top of each drive element.

A Vibration Measurement System (TSI Model 1941, TSI Incorporated, St. Paul, Minn.) was used to measure displacement of the surface of individual acoustic projectors in the acoustic blanket described above. The TSI Model 1941 is a non-contact system for detecting, monitoring, and measuring vibrations. The system is based on laser Doppler velocimetry (LDV) technology, and operates by scattering monochromatic light from the surface of interest and measuring the Doppler shift of the light frequency caused by the motion of the surface. The frequency shift is proportional to the surface velocity and, therefore, proportional to the surface displacement. The accuracy of the system is +/−0.4 dB, according to the TSI Incorporated Model 1941/1942 Vibration Measurement System Instruction Manual, Revision A, 1991.

The acoustic blanket manufactured as described above was hung vertically in free space, suspended from clips 110, as shown in FIG. 5*a*.

Figure 9:
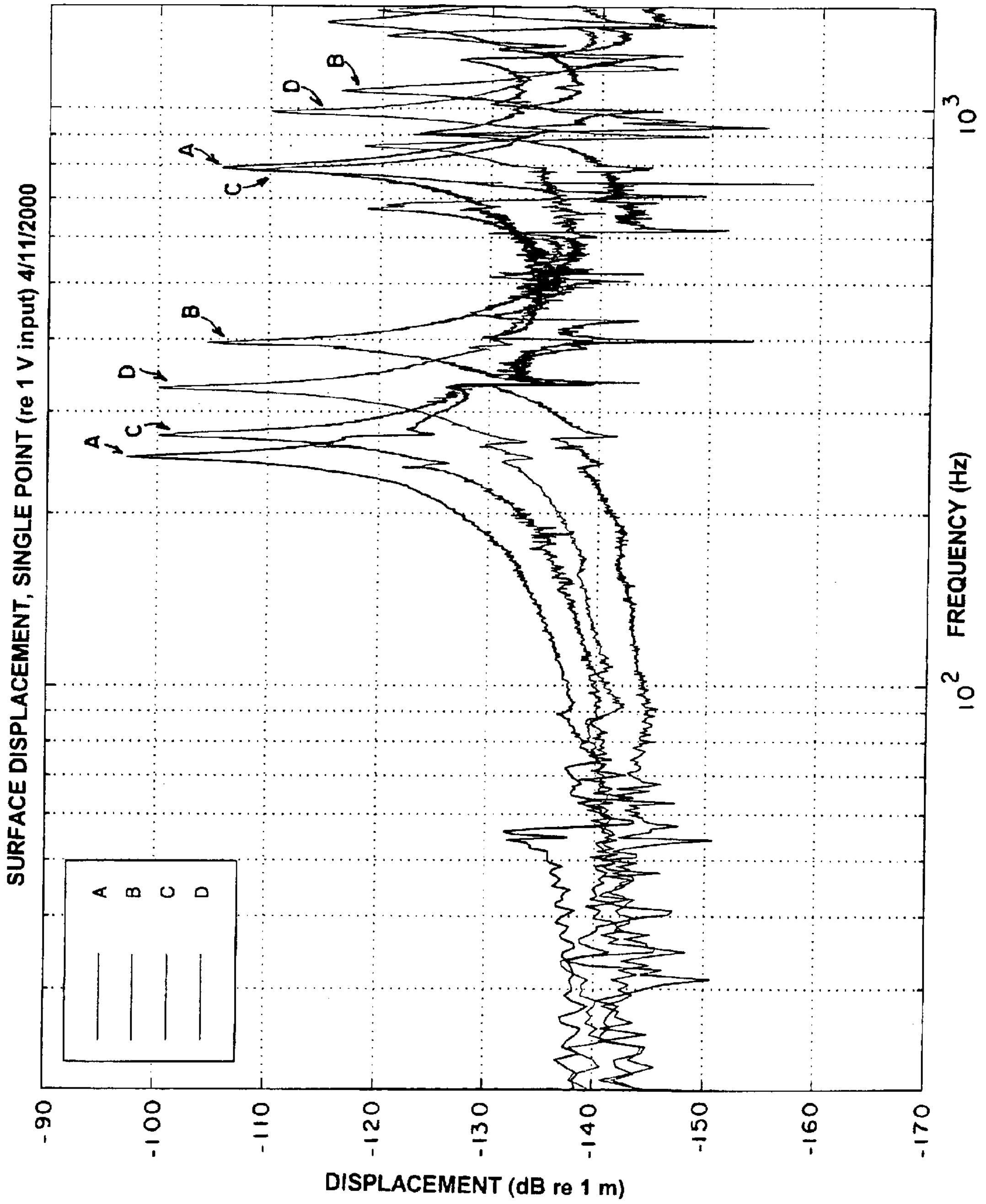
FIG. 9 is a plot of the displacement versus the frequency for several acoustic actuators in an acoustic blanket according to the invention.

A one Volt sinusoidal electrical signal was applied, at frequencies between 2 Hz and 3 kHz. FIG. 9 shows the displacement at the center point of the acoustic diaphragm of each of the four individual acoustic actuators (A, B, C, and D) as a function of frequency. Acoustic actuators A, B, C, and D are the top four actuators shown in FIG. 5*a*. The acoustic diaphragms of acoustic actuators A and C each have two layers of KJ polyimide film, while the acoustic diaphragms of acoustic actuators B and D each have three layers of KJ polyimide film.

According the results shown in FIG. 9, the peak displacement response of film bubble A is 16 μm (−96 dB//m/V) at 250 Hz, while the peak displacement of film bubble B is 10 μm (−100 dB//m/V) at 270 Hz and film bubble C is 10 μm (−100 dB//m/V) at 335 Hz, and the peak displacement of film bubble D is 6.3 μm (−104 dB//m/V) at 396 Hz.

Note that the peak displacements of the two layer film bubbles A and C are not the same, nor are the peak displacements of the three layer film bubbles B and D the same. The differences can be attributed to the locations of the film bubbles with respect to the top mounting of the acoustic blanket, to some mutual impedance coupling effects between the acoustic actuators since the spacing of the acoustic actuators is well within half a wavelength, and to possible off-center positioning of the laser beam during the measurements of the displacement.

The frequencies at which the peak responses occur are in the range of 250 Hz and 396 Hz for the acoustic actuators tested. These relatively low frequencies indicate the high output which may be achieved with this design.

Note that the piezoceramic drive element which was tested at 1 Volt rms could have been safely driven at up to 340 Volts rms.

Figure 10:
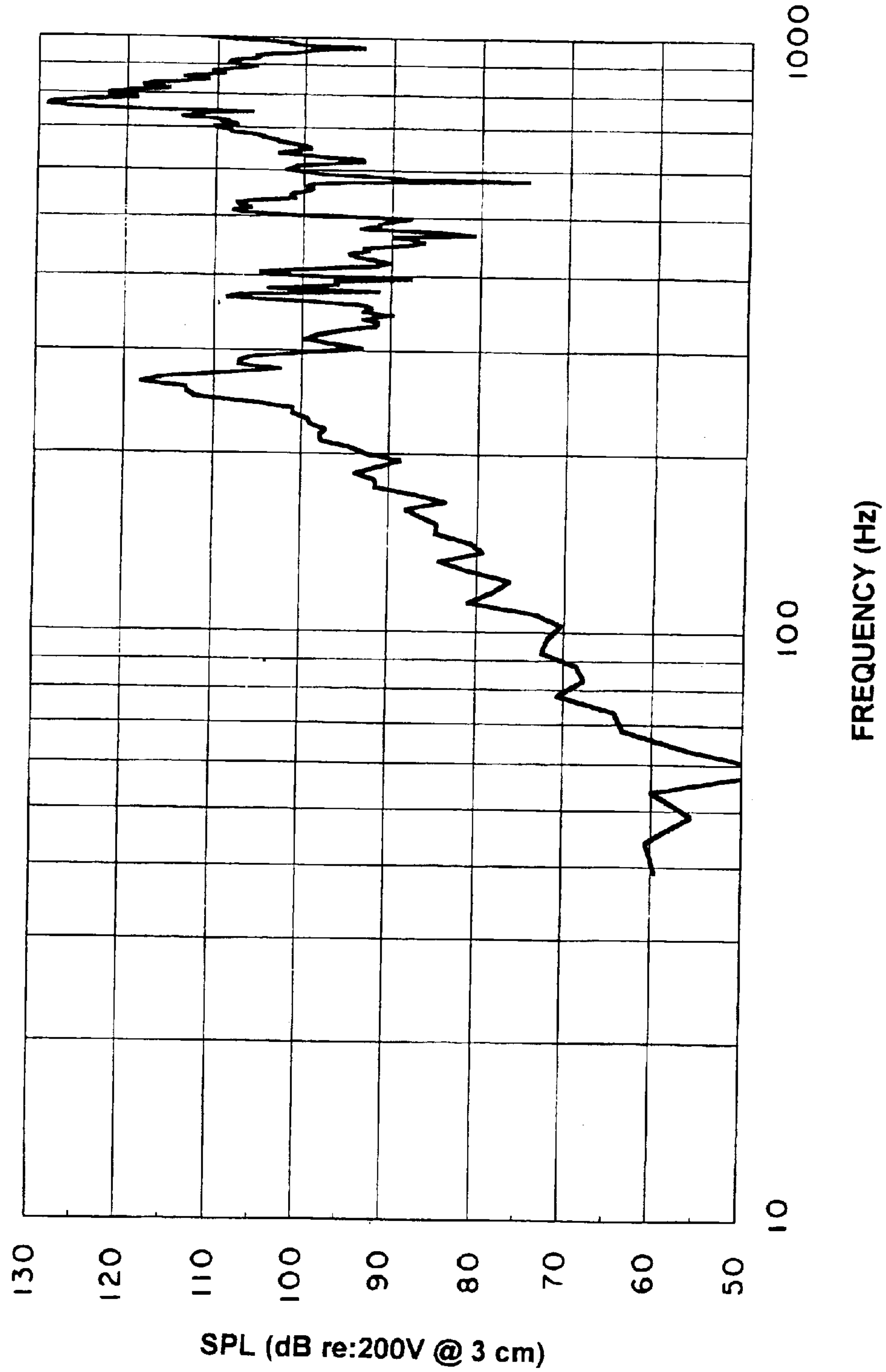
FIG. 10 is a plot of the sound pressure level versus frequency for an acoustic actuator in an acoustic blanket according to the invention.

In another test of the acoustic blanket, a microphone was used to record the sound output profile of the acoustic actuator A. The sound measurements were done in the time domain, and a Fast Fourier Transform (FFT) was performed to create a plot of the sound pressure level versus frequency. FIG. 10 illustrates the sound pressure level for a 200 Volt (peak) drive with the microphone located 3 centimeters in front of the center of acoustic actuator A. Note that the frequency response is in general agreement with the displacement results for acoustic actuator A in FIG. 9, in which the peak drum mode response is shown to occur at approximately 250 Hz with a sound pressure level of 118 dB.

EXAMPLE 2

Figure 11:
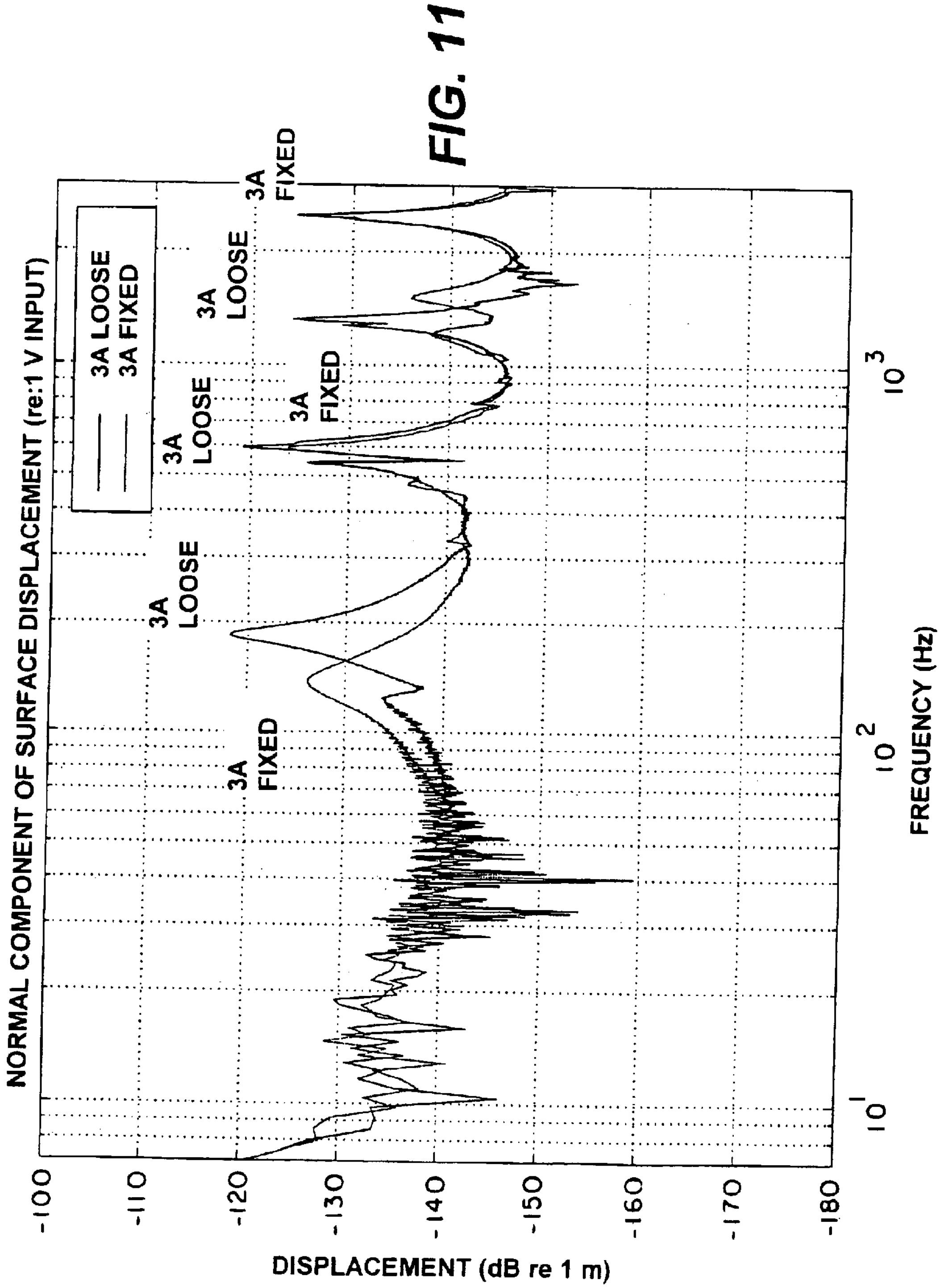
FIG. 11 is a plot of displacement versus frequency for acoustic actuators according to the invention.

FIG. 11 shows the peak displacement as measured at the center of the acoustic diaphragm for two mounting configurations over the frequency range of 2 Hz to 3,000 Hz for a one Volt (rms) drive for acoustic actuators with 3 layers of KJ polyimide, and a layer of Kapton E.

The acoustic blanket tested was constructed as follows:

A sheet of KJ polyimide film approximately 50 μm in thickness was cut into circular pieces about 10-cm in diameter.

The metal mold was coated with a release agent, and each 10-cm diameter piece of KJ polyimide film was placed over one of the eight steel disks. Note that on several of the disks, two layers or three layers of the KJ polyimide film were stacked, in order to achieve a thicker diaphragm. A 10-cm diameter piece of Kapton E was layered over the KJ polyimide film layer(s); to add stiffness and to decrease the breathing resonance frequency of the diaphragm. Finally, a sheet of fiberglass cloth, followed by another sheet of Kapton E film were layered over the Kapton E and KJ polyimide film circles.

The final sheet of Kapton E was sealed around the edges of the metal plate and the interior was evacuated with a mechanical pump. The assembly was then placed in an autoclave. The autoclave temperature and pressure were increased to 325° C. and 300 psi and maintained at this temperature and pressure for 3 hours, to thermoset the film. The autoclave was then brought back to ambient temperature and pressure. The KJ polyimide film conformed to the steel disks, and remained in this shape as the temperature and pressure were reduced to ambient. The resulting disk-shaped film bubbles were then removed from the autoclave, the film bubbles were removed from the mold, and the fiberglass layer was peeled off the film bubbles.

Following application of a release agent to the mold, successive layers were placed on the mold previously used for making the film bubbles. The first layer (the rear of the blanket) was a 33-cm by 61-cm sheet of Kapton E film having eight circular cut-outs corresponding to the locations of the steel disks of the mold. The cutouts were slightly larger than the 6.35-cm (2.5 in) diameter of the steel disks. A second identically sized sheet of KJ polyimide film with identical cut-outs was laid over the Kapton E film, to act as a thermoplastic adhesive to thermally bond all the component layers together. Thin nickel ribbon wires were then attached to the blanket using small pieces of Kapton tape to hold the wires in place. The drive signal wire lead and reference signal wire lead were placed so they extended beyond the edge of the acoustic blanket at each cutout.

The pre-formed individual film bubbles were placed on tie mold, with the edges of the bubbles overlapping the Kapton E and KJ polyimide film sheets. Another sheet of Kapton E film, dimensionally identical to the first, was laid over the film bubbles. A sheet of fiberglass cloth and a final layer of Kapton E were placed over the assembly, and the edges of the Kapton E film were sealed around the edges of the mold. A hole was cut in the Kapton E film, a vacuum fitting was attached, and a vacuum was applied to draw the assembly together and to ensure that there were no system leaks. The assembly was heated in an autoclave at a temperature of 325° C. and 300 psi for one hour, then removed from the autoclave. The acoustic blanket was then removed from the mold, and the Kapton/fiberglass cloth was removed from the acoustic blanket.

Completion of the acoustic blankets (addition of drive elements and soldering of the leads to the electrodes) was as described in example 1, above.

The displacement and sound pressure levels were measured for an acoustic actuator having three layers of KJ polyimide and one layer of Kapton E in the diaphragm.

In the first configuration (designated 3A loose on FIG. 11), the acoustic blanket was suspended from one edge by clips 110 as shown in FIG. 5*a*, and the other edges of the blanket were free. Upon application of the 1V sinusoidal signal, there were high tonal responses at 180 Hz, 575 Hz, 1.4 kHz, and 2.5 kHz. The tonal at 180 Hz reaches a peak displacement of 1.4 $\mu$m (−117 db//m/V) with a Q of 3 while the tonal at 575 Hz reaches a peak displacement at 1.1 $\mu$m (−119 db//m/V).

For the second configuration (designated 3A Fixed on FIG. 11), a self adhering cork insulation tape was used to fix the acoustic blanket to a vibration isolation table. The primary tonal, which was at 180 Hz for the loose configuration) was located at 135 Hz for the fixed configuration. The peak tonal displacement was reduced to 0.5 $\mu$m (−1265 dB//m/V). Although the peak tonal displacement was reduced, there was a broader frequency response.

Generally, higher tonal responses resulted from the 3A Loose configuration.

Figure 12:
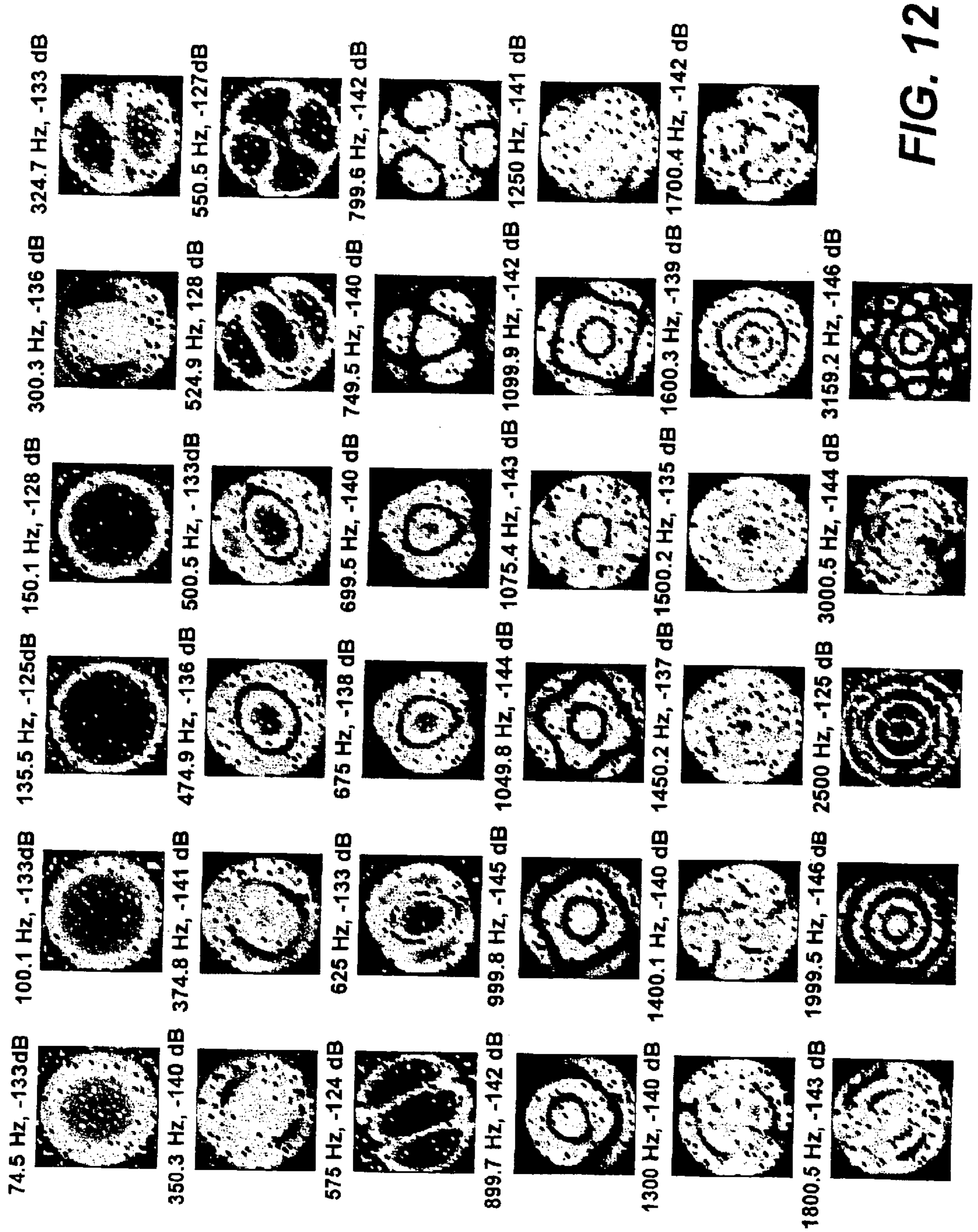
FIG. 12 shows scanning measurements of an acoustic diaphragm at various frequencies.

In addition to the displacements of the center of the acoustic diaphragm shown in FIG. 11, scanning measurements of the entire acoustic diaphragm were scanned in the 3A Fixed configuration. FIG. 12 shows the results of this scan at various frequencies. The classic drum head mode shapes of FIG. 12 illustrate the effectiveness of the acoustic actuator in producing good quality acoustic outputs. FIG. 12 illustrates that the acoustic actuator operates in a pure breathing mode at frequencies up to and including the primary mode frequency of 135.5 Hz.

Figure 13:
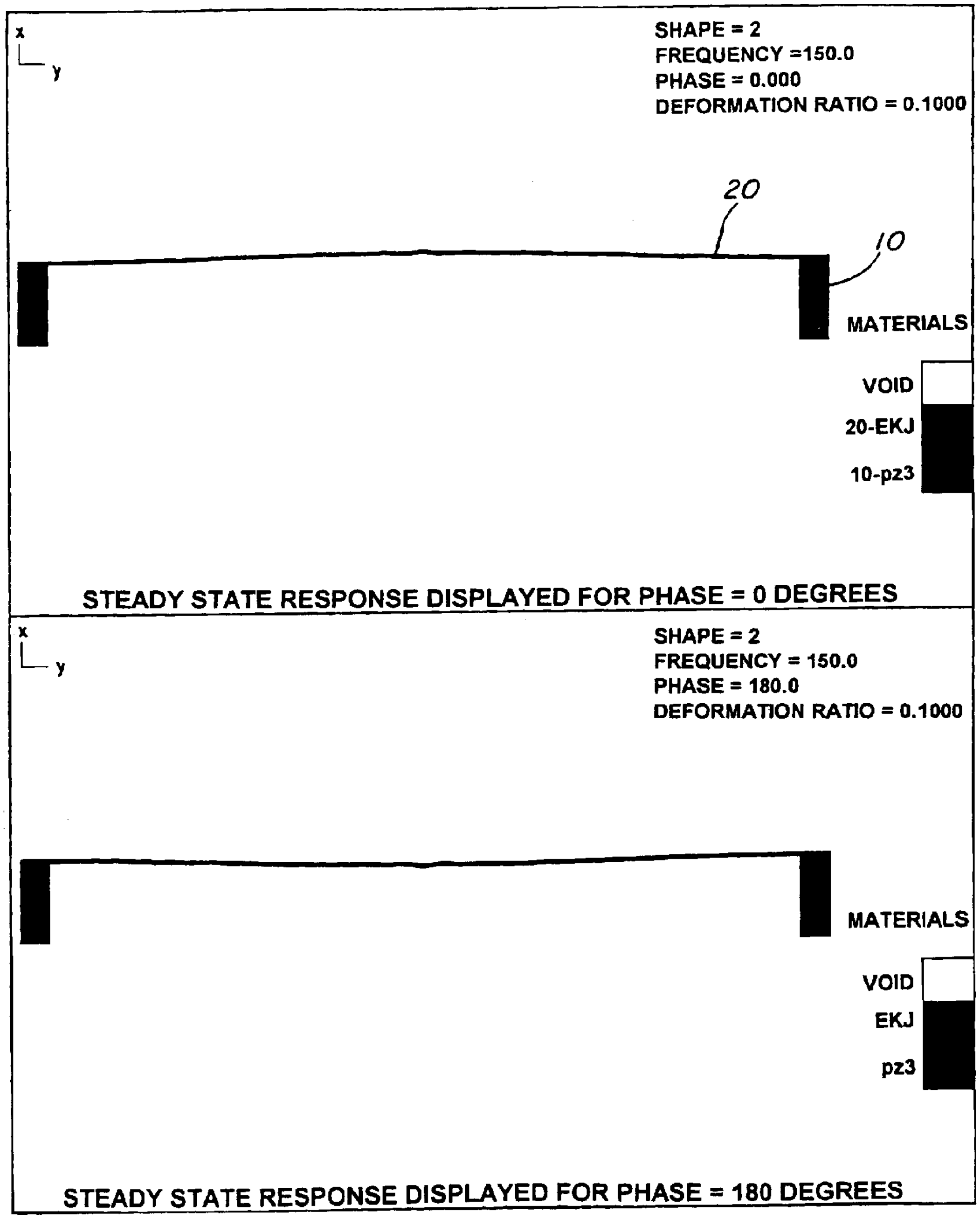
FIG. 13 illustrates a model of a single acoustic actuator vibrating at its breathing mode.

The upward and downward displacement of the acoustic diaphragm in a pure breathing mode is illustrated in FIG. 13, which illustrates a finite element model of a single acoustic actuator vibrating at its breathing mode.

Active Control System Applications

The acoustic actuators or acoustic blankets discussed above may be used in active control systems to produce sound or vibrations which destructively interfere with the unwanted sound or vibration. In active control systems, typically a sensor detects the disturbance signal (which may be acoustic, vibration, or a combination thereof), a processor reconfigures the signal, and a power amplifier drives an actuator such that the actuator's sound or vibration output has the same magnitude as the disturbance, but with an opposite phase.

The acoustic projectors described herein are particularly effective for active control systems due to their light weight, thin profile, high tonal displacement levels, and high acoustic generation levels. The thin profile of the acoustic projectors in particular makes the acoustic projectors effective for applications requiring thin, lightweight systems, including machinery spaces, ships, submarines, aircraft, launch vehicles, passenger vehicles, among others.

Alternative Embodiments

In another embodiment, the piezoelectric drive element can be manufactured in a ring shape then cut into two or more sectors. The sectors, laid end to end, act as the drive element of the acoustic actuators, and resonate in split ring manner.

Alternatively, the piezoelectric drive element may be in an oval or other shape, rather than the ring shape described above. Using a different shape is believed to affect the bandwidth of the response of the acoustic actuator.

Alternatively, the radially poled piezoelectric drive elements can be replaced by thickness poled piezoelectric disk drive elements. Although the thickness poled piezoelectric piezoelectric drivers would utilize their $d_{31}$ mode of operation instead of the $d_{33}$ mode, the flexural motion of the acoustic diaphragm, which is the primary means of acoustic generation, will remain essentially the same.

Two or more high displacement piezoelectric drivers such as those in the Reduced and Internally Biased Oxide Wafer (RAINBOW) or THUNDER configurations, arranged end to end, would also be useful drivers for the acoustic actuators. These pre-stressed ceramics have a piezoelectric layer and a primarily metallic lead layer, which could replace the above-described electrode used for the inner wall of the piezoelectric drive element. The RAINBOW drivers are further described in Matthew W. Hooker, "Properties and Performance of RAINBOW Piezoelectric Actuator Stacks" in Smart Structures and Materials, Janet M. Sater, Editor, Proceedings of SPIE Vol. 3044, 413–420 (1997), and Gene H. Haerting, "Rainbow Actuators and Sensors: A New Smart Technology" in Smart Structures and Materials, Proceedings of SPIE Vol 3040, 81–91 (1997), both of which are incorporated by reference in their entirety. It will be clear to those skilled in the art that the electrodes may also be located on another face of the drive element, as appropriate for the direction of the applied electrical field and direction of motion.

The above description of several embodiments of the invention is intended for illustrative purposes only. Numerous modifications can be made to the disclosed configuration, while still remaining within the scope of the invention. For a determination of the metes and bounds of the invention, reference should be made to the appended claims.

We claim:

1. An acoustic actuator, comprising:

an electrically active drive element, said drive element having major inner and outer faces and upper and lower surfaces, said drive element being poled in the radial direction, an acoustic diaphragm mechanically attached to said drive element, and an inner electrode disposed on said inner face of said drive element and an outer electrode disposed on said outer face of said drive element.

2. An acoustic projector as in claim 1, wherein said drive element is a piezoelectric or electrostrictive material.

3. An acoustic actuator as in claim 2, wherein said drive element is a member of the lead zirconate titanate family.

4. An acoustic actuator as in claim 1, wherein said inner electrode is a conductive metallic layer on said inner face of said drive element and said outer electrode is a conductive metallic layer on said outer face of said drive element.

5. An acoustic actuator as in claim 1, wherein said acoustic diaphragm is substantially planar.

6. An acoustic actuator as in claim 1, wherein said acoustic diaphragm has an dome shape.

7. An acoustic actuator as in claim 1, wherein said acoustic diaphragm comprises a thin flexible membrane or shell.

8. An acoustic actuator as in claim 7, wherein said acoustic diaphragm comprises a thermoplastic film.

9. An acoustic actuator as in claim 7, wherein said acoustic diaphragm comprises a polymer membrane.

10. An acoustic actuator as in claim 7, wherein said acoustic diaphragm comprises a multi-layer polymer membrane.

11. An acoustic actuator as in claim 10, wherein said multilayer polymer membrane comprises:

a layer of thermoplastic polyimide film, a layer of polyamide film, a layer of fiberglass cloth, and a second layer of polyamide film.

12. An acoustic actuator as in claim 1, wherein said acoustic diaphragm is attached to said drive element with an adhesive disposed between said acoustic diaphragm and said upper surface of said drive element.

13. An acoustic actuator as in claim 1, wherein said inner and outer surfaces of said drive element are substantially circular.

14. An acoustic actuator as in claim 1, wherein said inner and outer faces of said drive element are elliptical.

15. An acoustic actuator as in claim 1, wherein said drive element comprises a plurality of subelements arranged end-to-end, said subelements poled to expand or contract in response to an applied electrical signal.

16. An acoustic actuator as in claim 1, further comprising a backing disposed opposite said acoustic diaphragm.

17. An acoustic actuator as in claim 16, wherein said backing comprises a polymer membrane.

18. An acoustic actuator as in claim 16, wherein said acoustic diaphragm has excess material which extends beyond said outer surface of said drive elements, and wherein said backing is attached to said acoustic diaphragm excess material.

19. An acoustic actuator, comprising:

electrically active thickness poled drive subelements laid end to end, said drive subelements having major inner and outer faces and upper and lower surfaces, said drive subelements made from a reduced and internally biased oxide wafer of piezoelectric material, and an acoustic diaphragm mechanically attached to said drive elements.

20. An acoustic blanket comprising:

a plurality of electrically active drive elements, each drive element having major inner and outer faces, each drive element having an upper surface and a lower surface, an electrode on said inner face and an electrode on said outer face of said drive element, an acoustic sheet having indentations, each indentation comprising a film bubble sized to receive said drive elements.

21. An acoustic blanket as in claim 20, wherein said drive elements are mechanically attached to said acoustic sheet at said upper surface of said drive elements.

22. An acoustic blanket as in claim 20, further comprising electrical leads for connecting said electrodes to an external electrical power source.

23. An acoustic blanket as in claim 20, wherein said film bubbles comprise thin flexible film.

24. An acoustic blanket as in claim 20, wherein said film bubbles comprise a polymer membrane.

25. An acoustic blanket as in claim 21, wherein said film bubbles comprise a thermoplastic film.

26. An acoustic blanket as in claim 25, wherein said film bubbles comprise a thermoplastic polyimide film.

27. An acoustic blanket as in claim 20, wherein said film bubbles comprise:

a layer of thermoplastic polyimide film, a layer of polyamide film, a layer of fiberglass cloth, and a second layer of polyamide film.

28. An acoustic blanket as in claim 22, wherein said acoustic sheet comprises:

a layer of thermoplastic polyimide film, a layer of polyamide film, and a layer of thermoplastic polyimide film.

29. An acoustic blanket as in claim 20, wherein said inner electrode comprises a conductive layer on said inner face of said drive element and said outer electrode comprises a conductive layer on said outer face of said drive element.

30. An acoustic blanket as in claim 20, further comprising a backing attached to said acoustic sheet.

31. An acoustic actuator, comprising:

an electrically active drive element, the drive element having major inner and outer faces and upper and lower surfaces, the drive element being poled in the radial direction, and an acoustic diaphragm mechanically attached to the drive element, wherein the acoustic diaphragm includes a thin flexible multi-layer polymer membrane or shell.

32. An acoustic actuator as in claim 31, wherein the multi-layer polymer membrane or shell comprises:

a layer of thermoplastic polyimide film, a layer of polyamide film, a layer of fiberglass cloth, and a second layer of polyamide film.

33. An acoustic actuator, comprising:

an electrically active drive element, the drive element having major inner and outer faces and upper and lower surfaces, the drive element being poled in the radial direction, and an acoustic diaphragm mechanically attached to the drive element, wherein the inner and outer faces of the drive element are elliptical.

34. An acoustic actuator as in claim 33, wherein the acoustic diaphragm is substantially planar.

35. An acoustic actuator as in claim 33, wherein the acoustic diaphragm has an dome shape.

36. An acoustic actuator as in claim 33, wherein the acoustic diaphragm comprises a thin flexible membrane or shell.

37. An acoustic actuator as in claim 33, wherein the acoustic diaphragm comprises a thermoplastic film.

38. An acoustic actuator as in claim 33, wherein the acoustic diaphragm comprises a polymer membrane.

39. An acoustic actuator as in claim 33, wherein the acoustic diaphragm comprises a multi-layer polymer membrane.

40. An acoustic actuator as in claim 33, wherein the multilayer polymer membrane comprises:

a layer of thermoplastic polyimide film, a layer of polyamide film, a layer of fiberglass cloth, and a second layer of polyamide film.

41. An acoustic actuator as in claim 33, wherein the acoustic diaphragm is attached to the drive element with an adhesive disposed between the acoustic diaphragm and the upper surface or lower surface of the drive element.

42. An acoustic actuator as in claim 33, wherein the drive element includes a plurality of subelements arranged end-to-end, the subelements being poled to expand or contract in response to an applied electrical signal.

43. An acoustic actuator, comprising:

an electrically active drive element, the drive element having major inner and outer faces and upper and lower surfaces, the drive element being poled in the radial direction, and an acoustic diaphragm mechanically attached to the drive element, wherein the drive element comprises a plurality of subelements arranged end-to-end, the subelements poled to expand or contract in response to an applied electrical signal.

44. An acoustic actuator as in claim 43, wherein the acoustic diaphragm is substantially planar.

45. An acoustic actuator as in claim 43, wherein the acoustic diaphragm has an dome shape.

46. An acoustic actuator as in claim 43, wherein the acoustic diaphragm includes a thin flexible membrane or shell.

47. An acoustic actuator as in claim 43, wherein the acoustic diaphragm includes a thermoplastic film.

48. An acoustic actuator as in claim 43, wherein the acoustic diaphragm includes a polymer membrane.

49. An acoustic actuator as in claim 43, wherein the acoustic diaphragm comprises a multi-layer polymer membrane.

50. An acoustic actuator as in claim 43, wherein the multilayer polymer membrane comprises:

a layer of thermoplastic polyimide film, a layer of polyamide film, a layer of fiberglass cloth, and a second layer of polyamide film.

51. An acoustic actuator as in claim 43, wherein the acoustic diaphragm is attached to the drive element with an adhesive disposed between the acoustic diaphragm and the upper surface or lower surface of the drive element.

52. An acoustic actuator, comprising:

an electrically active drive element, the drive element having major inner and outer faces and upper and lower surfaces, the drive element being poled in the radial direction, and an acoustic diaphragm mechanically attached to the drive element, and a backing disposed opposite the acoustic diaphragm.

53. An acoustic actuator as in claim 52, wherein the backing includes a polymer membrane.

54. An acoustic actuator as in claim 52, wherein the acoustic diaphragm has excess material which extends beyond the outer face of the drive element, and wherein the backing is attached to the acoustic diaphragm excess material.

55. An acoustic actuator, comprising:

an electrically active drive element, the drive element having major inner and outer faces and upper and lower surfaces, the drive element being poled in the radial direction, and an acoustic diaphragm mechanically attached to the drive element, wherein the acoustic diaphragm comprises a thermoplastic film.

56. An acoustic actuator, comprising:

an electrically active drive element, the drive element having major inner and outer faces and upper and lower surfaces, the drive element being poled in the radial direction, and an acoustic diaphragm mechanically attached to the drive element wherein the acoustic diaphragm comprises a polymer membrane.

* * * * *